(12) United States Patent
Wei

(10) Patent No.: US 9,461,222 B1
(45) Date of Patent: Oct. 4, 2016

(54) LIGHT-EMITTING ELEMENT AND THE LIGHT-EMITTING MODULE THEREOF

(71) Applicant: Epistar Corporation, Hsinchu (TW)

(72) Inventor: Chih-Hao Wei, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 28 days.

(21) Appl. No.: 14/788,233

(22) Filed: Jun. 30, 2015

(51) Int. Cl.
*H01L 33/00* (2010.01)
*H01L 33/62* (2010.01)
*H01L 49/02* (2006.01)
*H01L 33/52* (2010.01)
*H01L 33/44* (2010.01)
*H01L 33/46* (2010.01)

(52) U.S. Cl.
CPC ............... *H01L 33/62* (2013.01); *H01L 28/10* (2013.01); *H01L 33/44* (2013.01); *H01L 33/46* (2013.01); *H01L 33/52* (2013.01)

(58) Field of Classification Search
CPC ....... H01L 33/62; H01L 28/10; H01L 33/46; H01L 33/52; H01L 33/44
See application file for complete search history.

(56) References Cited

U.S. PATENT DOCUMENTS

| 4,622,495 | A | 11/1986 | Smeelen | |
| 5,497,028 | A * | 3/1996 | Ikeda | H01L 27/08 257/531 |
| 5,498,928 | A | 3/1996 | Lapatovich et al. | |
| 5,500,552 | A * | 3/1996 | Ikeda | H01L 27/08 257/531 |
| 5,909,050 | A | 6/1999 | Furey et al. | |
| 2011/0304012 | A1* | 12/2011 | Kim | H01L 21/56 257/531 |
| 2012/0112866 | A1* | 5/2012 | Matsumoto | H01F 27/22 336/61 |
| 2012/0262432 | A1 | 10/2012 | Kamata et al. | |
| 2013/0134873 | A1* | 5/2013 | Waffenschmidt | F21V 23/02 315/71 |

* cited by examiner

*Primary Examiner* — Victor A Mandala
(74) *Attorney, Agent, or Firm* — Muncy, Geissler, Olds & Lowe, P.C.

(57) ABSTRACT

A light-emitting element, comprises: a substrate; a light-emitting stack formed on the substrate, comprising a first semiconductor layer having a first surface facing the substrate, a second semiconductor layer having a second surface opposite the first surface, and an active layer between the first semiconductor layer and the second semiconductor layer; an insulating adhesive layer formed between the light-emitting stack and the substrate; and an inductive coil embedded in the insulating adhesive layer, comprising a first end electrically connecting the first semiconductor layer, and a second end electrically connecting the second semiconductor layer.

8 Claims, 11 Drawing Sheets

LIGHT-EMITTING ELEMENT AND THE LIGHT-EMITTING MODULE THEREOF

TECHNICAL FIELD

The application relates to a light-emitting element and the light-emitting module thereof, in particular, relates to a light-emitting element activated by an inductive current and the light-emitting module thereof.

DESCRIPTION OF BACKGROUND ART

The lighting theory of light-emitting diodes (LEDs) is that electrons combine with holes in the active layer between an n-type semiconductor and a p-type semiconductor, a photon of energy is released. Accordingly light is generated by LEDs. Because the light radiation theory of LED is different from the incandescent light which heats the filament, the LED is called a "cold" light source. Moreover, the LED is more sustainable, longevous, light and handy, and has less power-consumption, therefore it is considered as another option of the light source for the illumination markets. The LED applies to various applications like the traffic signal, backlight module, street light, and medical instruments, and is gradually replacing the traditional lighting sources.

A light-emitting device may include a substrate, a light-emitting stack including an n-type semiconductor layer, an active layer and a p-type semiconductor layer. The light-emitting stack may have roughened structure on the surface thereof to enhance light extraction.

In addition, the light emitting device can further connecting to other components in order to form a light emitting apparatus. The light-emitting device may be mounted onto a submount with the side of the substrate, or a solder bump or a glue material may be formed between the submount and the light-emitting device, therefore a light-emitting apparatus is formed. Besides, the submount further comprises the circuit layout electrically connecting the electrode of the light-emitting device via an electrical conductive structure such as a metal wire.

SUMMARY OF THE DISCLOSURE

A light-emitting element, comprises: a substrate; a light-emitting stack formed on the substrate, comprising a first semiconductor layer having a first surface facing the substrate, a second semiconductor layer having a second surface opposite the first surface, and an active layer between the first semiconductor layer and the second semiconductor layer; an insulating adhesive layer formed between the light-emitting stack and the substrate; and an inductive coil embedded in the insulating adhesive layer, comprising a first end electrically connecting the first semiconductor layer, and a second end electrically connecting the second semiconductor layer.

A light-emitting module, comprises: a submount; a light-emitting element formed on the submount, comprising a first semiconductor layer having a first surface facing the submount, a second semiconductor layer having a second surface facing the submount, and an active layer between the first semiconductor layer and the second semiconductor layer; a first electrode formed between the submount and the first semiconductor layer; a second electrode formed between the submount and the second semiconductor layer; and an inductive coil embedded in the submount, comprising a first end electrically connecting the first electrode, and a second end electrically connecting the second electrode.

DETAILED DESCRIPTION OF PREFERRED EMBODIMENTS

Figure 1A:
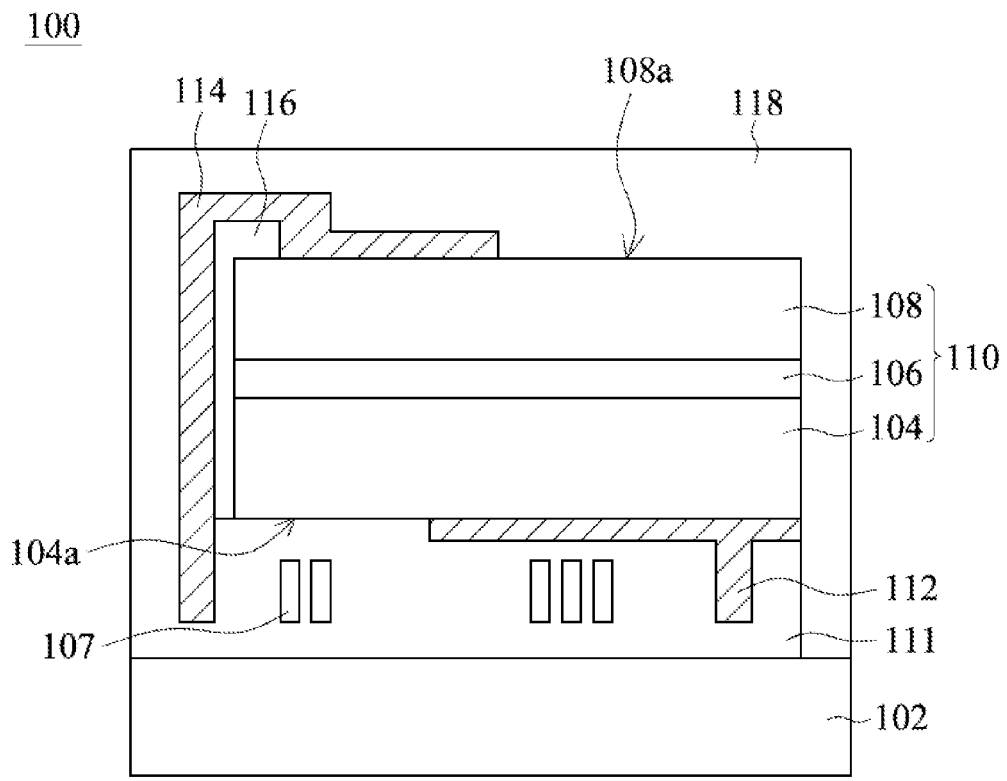
FIGS. 1A and 1B show a light-emitting element in accordance with one embodiment of the present application.
Figure 1B:
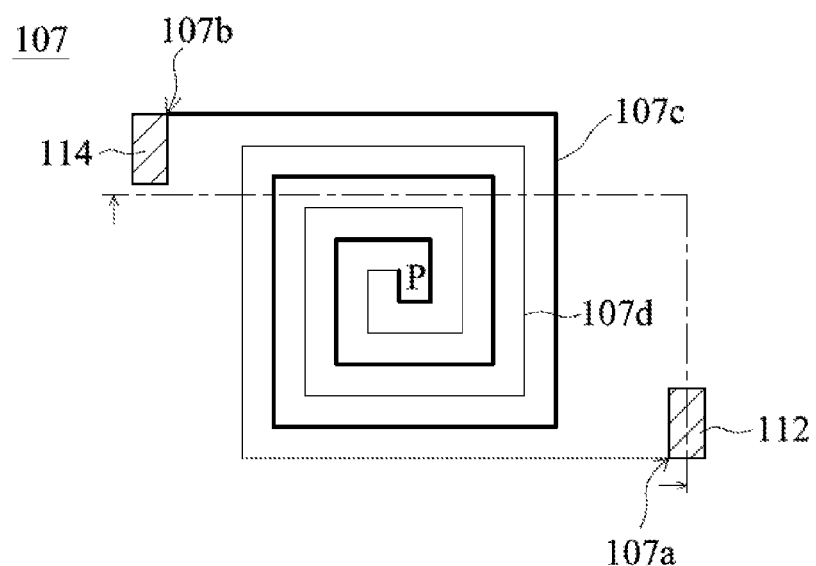

Referring to FIGS. 1A and 1B, a light-emitting element 100 in accordance with one embodiment of the present application is disclosed. As shown in a cross-sectional diagram FIG. 1A, the light-emitting element 100 comprises: a substrate 102; a light-emitting stack 110 formed on the substrate 102 and comprising a first semiconductor layer 104 having a first surface 104a facing the substrate 102, a second semiconductor layer 108 having a second surface 108a opposite the first surface 104a, and an active layer 106 between the first semiconductor layer 104 and the second semiconductor layer 108; an insulating adhesive layer 111 between the light-emitting stack 110 and the substrate 102; and an inductive coil 107 embedded in the insulating adhesive layer 111. The light-emitting stack 110 is epitaxially grown from an epitaxial substrate (not shown), and then the insulating adhesive layer 111 is provided to attach the light-emitting stack 110 to the substrate 102. After the light-emitting stack 110 is fixed on the substrate 102 via the insulating adhesive layer 111, the epitaxial substrate can be removed by substrate-removing method, such as laser lift off method. A first connecting portion 112 and a second connecting portion 114 electrically connect the first semiconductor layer 104 and the second semiconductor layer 108, respectively. A portion of the second connecting portion 114 is formed along the side surface of the light-emitting stack 110, and a dielectric layer 116 is formed between the side surface of the light-emitting stack 110 and the second connecting portion 114 to avoid an electrical short between the light-emitting stack 110 and the second connecting portion 114.

As shown in FIG. 1B, from a top-perspective view of the light-emitting element 100, the inductive coil 107 comprises a first end 107a electrically connecting the first semiconductor layer 104 via the first connecting portion 112, and a second end 107b electrically connecting the second semiconductor layer 108 via the second connecting portion 114. The first end 107a and the second end 107b are at the outermost part of the inductive coil 107. The inductive coil 107 further comprises a first spiral 107c and connecting a second spiral 107d at a central point P thereof, and the first spiral 107c and the second spiral 107d are coplanar and embedded in the insulating adhesive layer 111. In the embodiment, the first end 107a and the second end 107b are at the outermost part of the first spiral 107c and a second spiral 107d, respectively. Each of the first spiral 107c and the second spiral 107d has multiple turns, and each of the first spiral 107c and the second spiral 107d can have more turns than that shown in FIG. 1B. The number of turns of the first spiral 107c and the second spiral 107d can be from 100 to 200.

The material of the inductive coil 107 can comprise conductive metal comprising Ti, Au, Al, Cu, Ag, or metal having high magnetic susceptibility, such as Fe, Ni or Co.

The light-emitting stack 110 can comprise III-V group semiconductor material such as $Al_{x1}In_{y1}Ga_{(1-x1-y1)}N$, wherein 0≤x1, y1 ≤1, (x1+y1)≤1 or $Al_{x2}In_{y2}Ga_{(1-x2-y2)}P$, wherein 0≤x2, y2≤1, (x2+y2)≤1. In accordance with the material of the active layer 106, the emitted light thereof can be green light having a peak wavelength between 530 nm and 570 nm, blue light having a peak wavelength between 450 nm and 490 nm, ultraviolet light having a peak wavelength between 275 nm and 405 nm, or red light having a peak wavelength between 620 nm and 660 nm.

The substrate 102 can comprise insulating substrate such as sapphire, diamond or glass, or heat-dissipation substrate such as ceramic or metal.

The material of the insulating adhesive layer 111 can be selected from one of the group consisting of polyimide, benzocyclobutene (BCB), prefluorocyclobutane (PFCB), indium tin oxide and silicon dioxide.

Figure 1C:
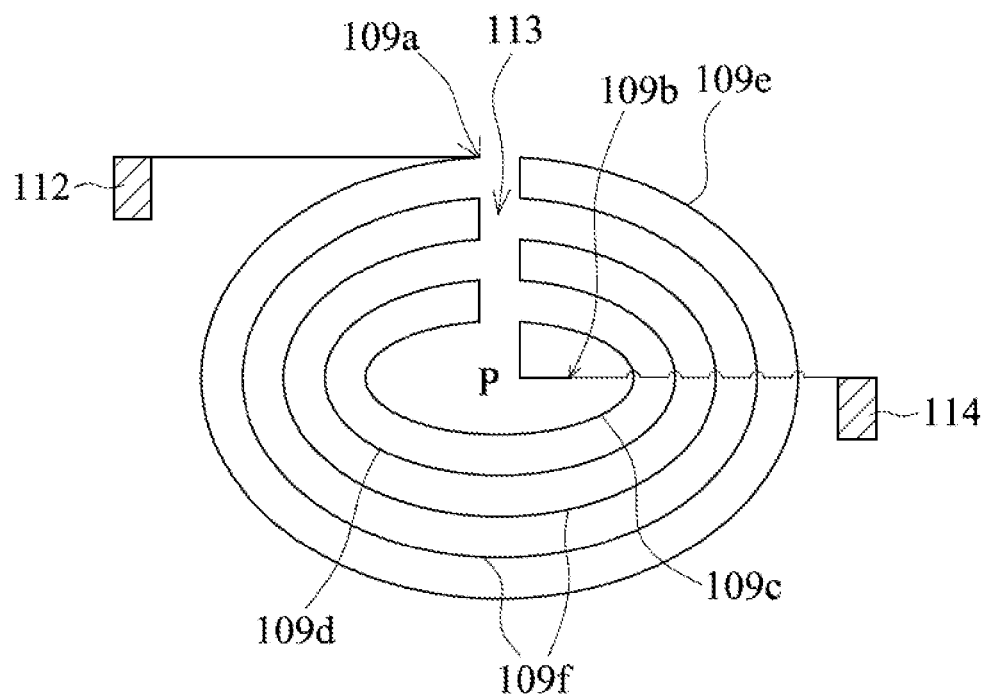
FIG. 1C shows an inductive coil in accordance with one embodiment of the present application.

Referring to FIG. 1C, an inductive coil 109 in accordance with one embodiment of the present application is disclosed. The inductive coil 107 in the light-emitting element 100 can be replaced by the inductive coil 109. The inductive coil 109 comprises a central point P, a first end 109a electrically connecting the first semiconductor layer 104 via the first connecting portion 112, a second end 109b electrically connecting the second semiconductor layer 108 via the second connecting portion 114, a first C-shaped turn 109c surrounding the central point P and a second C-shaped turn 109d surrounding and connecting the first C-shaped turn 109c, a plurality of C-shaped turns 109f sequentially surrounding the second C-shaped turn 109d, and an outmost C-shaped turn 109e having the first end 109a. An opening 113 is through the first C-shaped turn 109c, the second C-shaped turn 109d, the plurality of C-shaped turns 109f and the outmost C-shaped turn 109e. The first C-shaped turn 109c is the innermost C-shaped turn passing through the central point P and connecting the second end 109b. The number of the plurality of C-shaped turns 109f shown in FIG. 1C is two, however the practical number of C-shaped turns 109f can be more than that shown in FIG. 1C. The number of the first C-shaped turn 109c, the second C-shaped turn 109d, the plurality of C-shaped turns 109f and the outmost C-shaped turn 109c can be between 50 to 100.

Figure 1D:
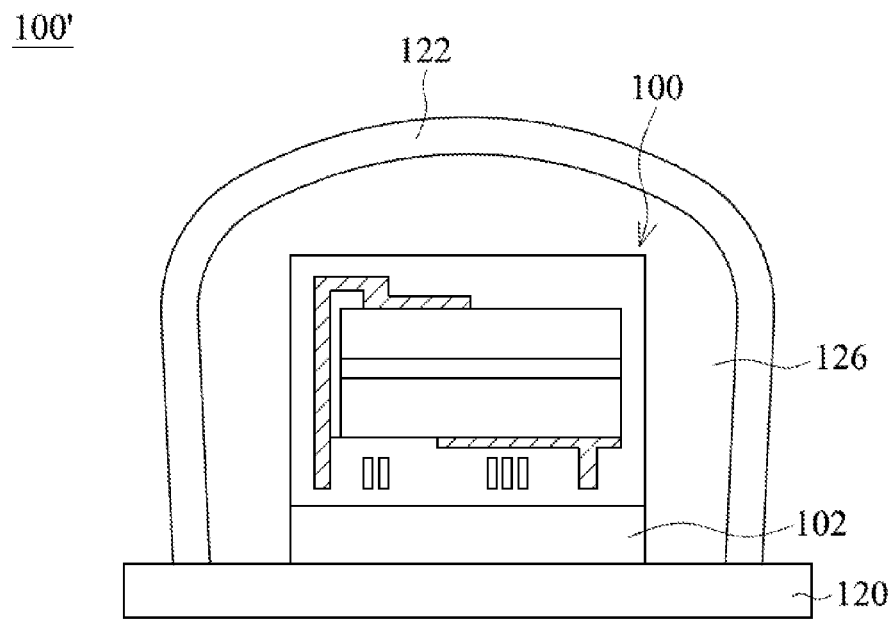
FIG. 1D shows a light-emitting module in accordance with one embodiment of the present application.

Referring to a cross-sectional diagram FIG. 1D, a light-emitting module 100' having the light-emitting element 100 in accordance with one embodiment of the present application is disclosed. The light-emitting package 100' comprises a submount 120 carrying the light-emitting element 100, and the substrate 102 is fixed on the submount 120. An encapsulating member 122 is formed on the submount 120 and covers the light-emitting element 100. The shape of the encapsulating member 122 can comprise cannonball-like shape. The material of the encapsulating member 122 can comprise water-proof material such as silicone. An intermedia layer 126 can be formed between the light-emitting element 100 and the encapsulating member 122, and the material of the intermedia layer 126 comprises wavelength-converting material such as YAG:Ce, aluminate, silicate, nitride or oxy-nitride. The intermedia layer 126 also comprises photo catalyst such as $TiO_2$.

Figure 1E:
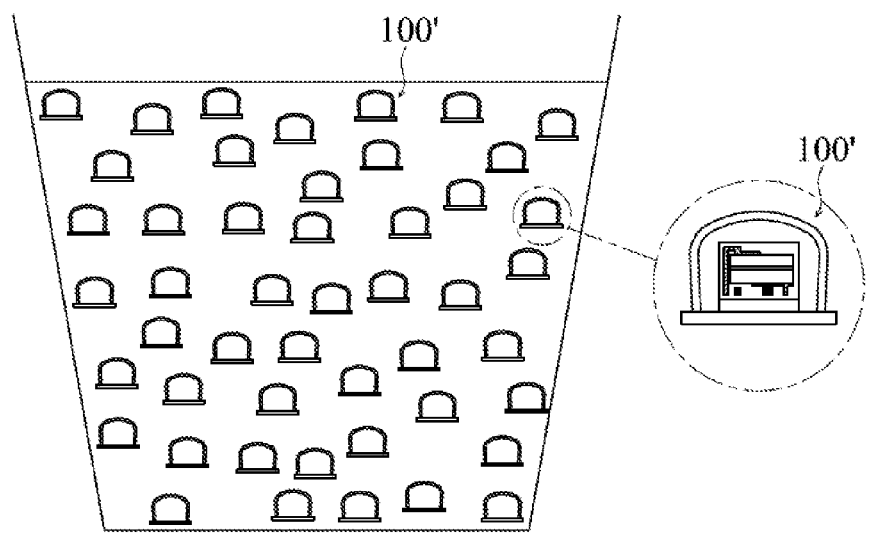
FIG. 1E shows an ultraviolet disinfection application with light-emitting modules in accordance with one embodiment of the present application.

Referring to a cross-sectional diagram FIG. 1E, an ultraviolet disinfection application with light-emitting modules 100' in accordance with one embodiment of the present application is disclosed. In the present embodiment, the light-emitting element 100 comprises nitride based material such as $Al_{x1}In_{y1}Ga_{(1-x1-y1)}N$, wherein 0<x1, y1≤1 and the light-emitting peak wavelength of the light-emitting element 100 can be between 225 nm and 390 nm which is an UV light wavelength, and the light-emitting module 100' comprising the light-emitting element 100 can be applied to ultraviolet disinfection. As shown in FIG. 1E, a plurality of light-emitting module 100' are arranged in a water container 123 such as a tank, and a magnetic field producer (not shown) is engaged with the water container 123 to release the magnetic field. In another embodiment, a magnetic field producer can be arranged outside of the water container 123 and release the magnetic field. The magnetic field is provided to activate the inductive coils embedded in each light-emitting module 100' to produce an inductive current. The inductive current is provided to the light-emitting stack 110 of each light-emitting module 100', and then each light-emitting stack 110 can be activated to emit an ultraviolet light in a wavelength between 360 nm to 390 nm. The intermedia layer 126 in FIG. 1D comprising a photo catalyst such as $TiO_2$ formed on the light-emitting element 100 can be activated to decompose bacterium or germ to $H_2$ and $O_2$ via an oxidation, therefore water in the water container 123 is disinfested. The light-emitting module 100' can also emit an ultraviolet light in a wavelength between 225 nm to 270 nm to directly break DNA and RNA of bacterium or germ.

Figure 1F:
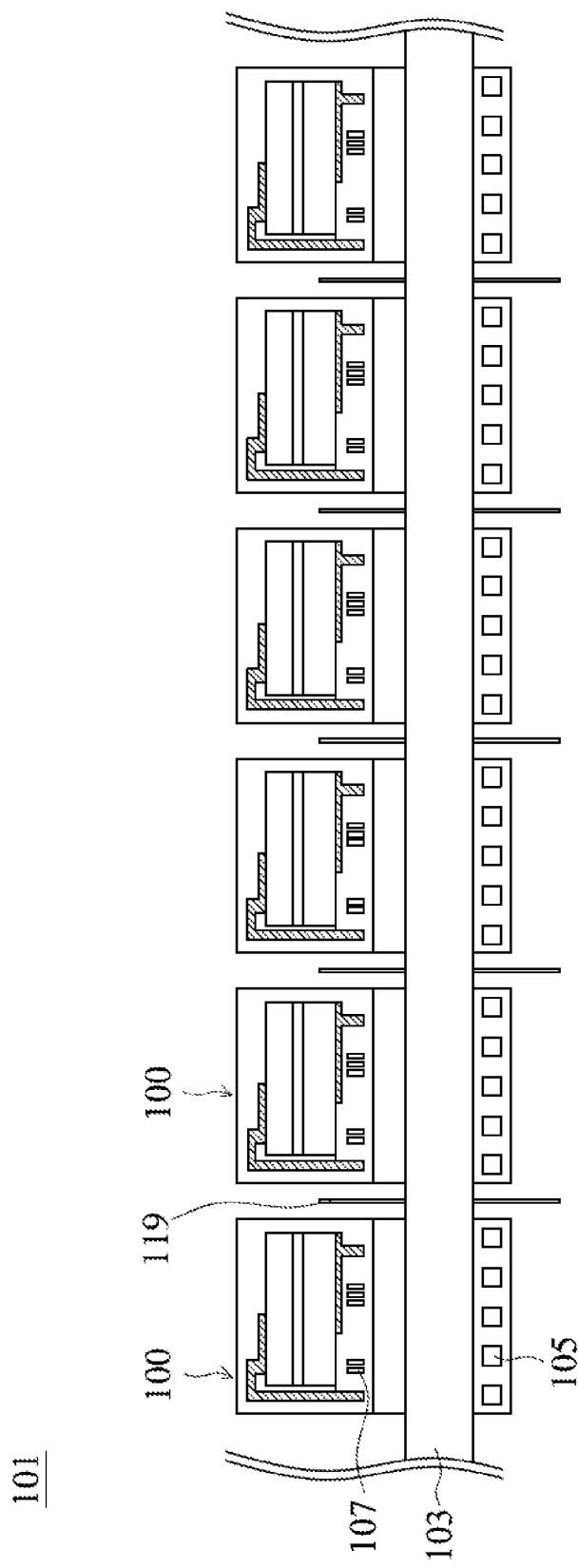
FIGS. 1F and 1G show a display in accordance with one embodiment of the present application.
Figure 1G:
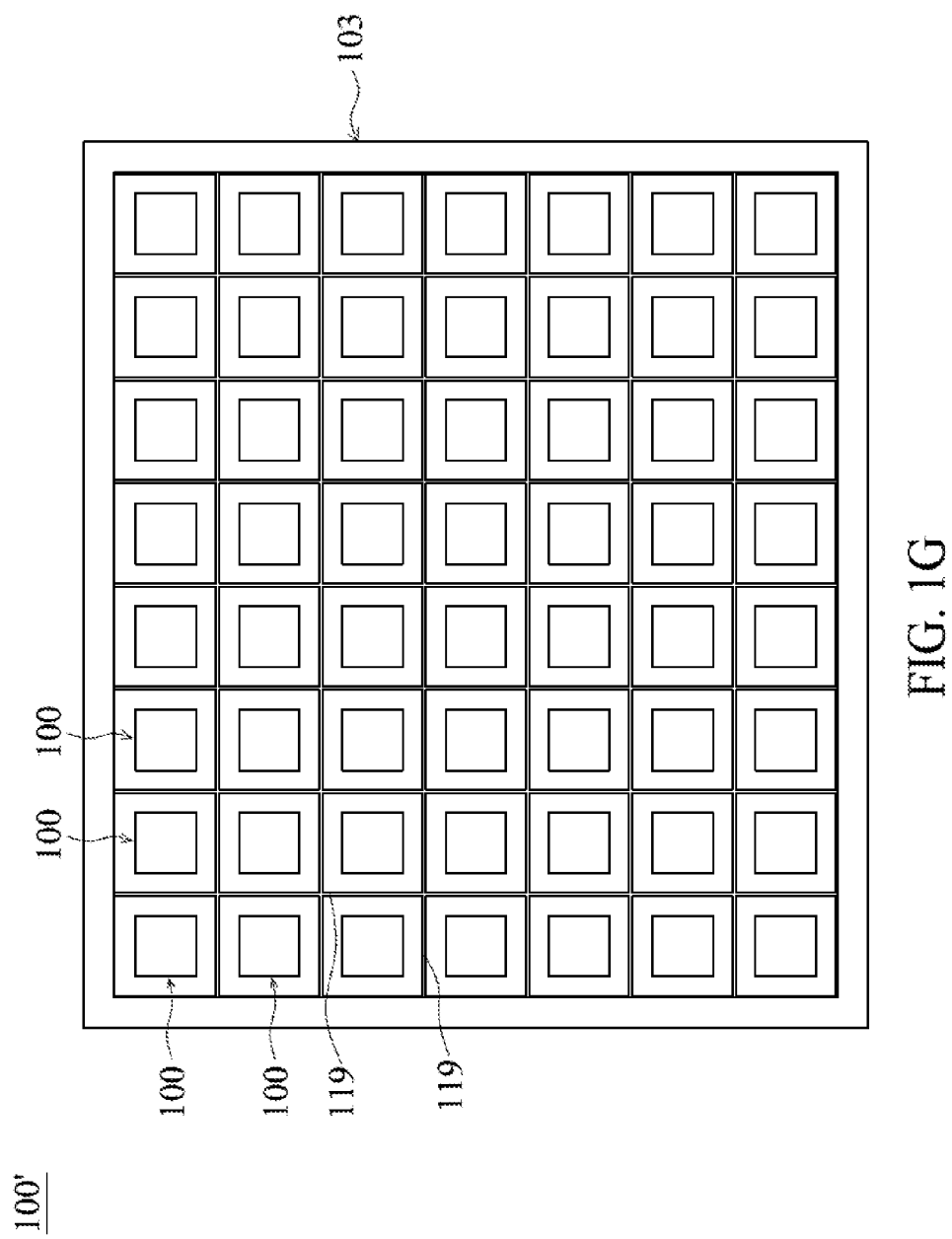

Referring to a cross-sectional diagram FIG. 1F, a display 101 in accordance with one embodiment of the present application is disclosed. Light-emitting elements in accordance with the present embodiments are applied to the display 101. The display 101 comprises a panel 103, a plurality of light-emitting elements 100 formed on a side of the panel 103, and a plurality of magnetic field producers 105 formed on another side of the panel 103 under the light-emitting elements 100. Each light-emitting element 100 can represent a pixel such as blue, green or red pixel. In one embodiment, each magnetic field producer 105 can be an inductive coil for providing a magnetic field to each individual inductive coil 107 of the light-emitting element 100, and each inductive coil 107 can be individually activated by the corresponding magnetic field producer 105. Each light-emitting element 100 emits light when the inductive coil 107 thereof receives magnetic field from the corresponding magnetic field producer 105. Referring to a top-view diagram FIG. 1G, a plurality of magnetic-screening boards 119 can surround the light-emitting elements 100 and the magnetic field producer 105 to avoid magnetic field interruption between the light-emitting elements 100 and the magnetic field producer 105.

Figure 2A:
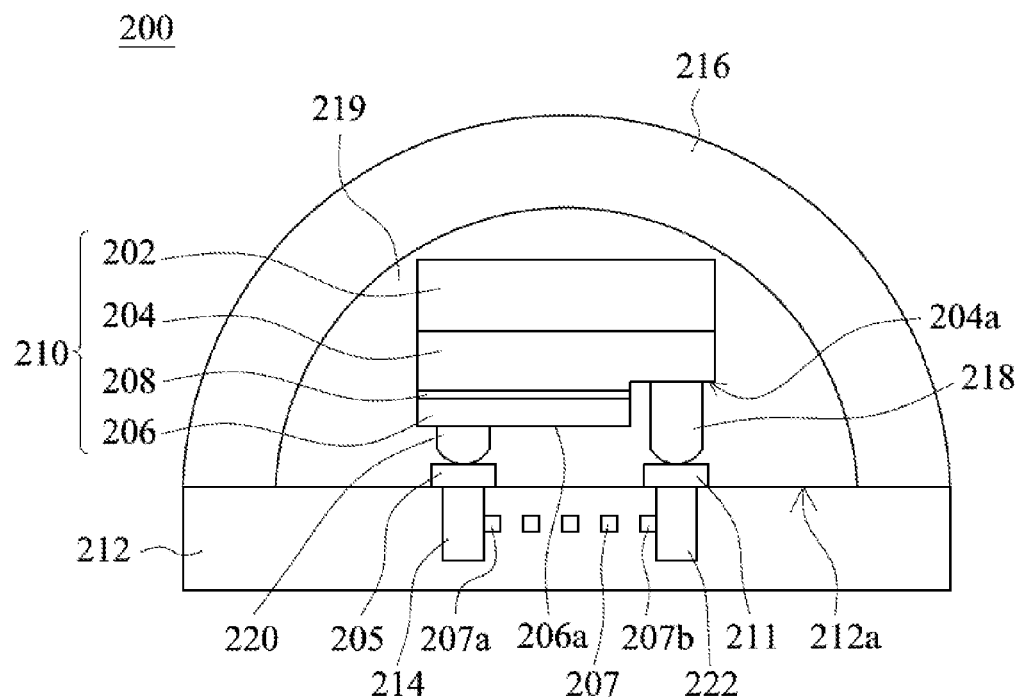
FIG. 2A shows a light-emitting module in accordance with one embodiment.

Referring to a cross-sectional diagram FIG. 2A, a light-emitting module 200 in accordance with one embodiment of the present application is disclosed. The light-emitting module 200 comprises: a submount 212; a light-emitting element 210 formed on the submount 212, comprising a first semiconductor layer 206 having a first surface 206a facing the submount 212, a second semiconductor layer 204 having a second surface 204a facing the submount 212, and an active layer 208 between the first semiconductor layer 206 and the second semiconductor layer 204; and an inductive coil 207 embedded in the submount 212, comprising a first end 207a electrically connecting the first semiconductor layer 206 via a first connecting portion 214, a first contact 205 and a first electrode 220, and a second end 207b electrically connecting the second semiconductor layer 204 via a second connecting portion 222, a second contact 211 and a second electrode 218. The second surface 204a is farther away the submount 212 than the first surface 206a, that is, a portion of the first semiconductor layer 206 and the active layer 208 are removed to expose the second surface 204a.

The submount 212 comprises an upper surface 212a disposing the first contact 205 and the second contact 211. The first contact 205 connects the first end 207a via the first connecting portion 214 in the submount 212, and the second contact 211 connects the second end 207b via the second connecting portion 222 in the submount 212. The first electrode 220 can be disposed on the first surface 206a and electrically connecting the first contact 205, and the second electrode 218 can be disposed on the second surface 204a and electrically connecting the second contact 211.

The light-emitting element 210 further comprises a current spreading layer (not shown) formed on the first surface 206 and a reflective metal layer (not shown) on the current spreading layer. The light-emitting element 210 further comprises a substrate 202 on the second semiconductor layer 204, and the substrate 202 can be a template substrate for epitaxial growth such as sapphire, diamond, glass or ceramic.

A wavelength-converting member 219 such as YAG:Ce, aluminate, silicate, nitride or oxy-nitride can be covered on the light-emitting element 210 and an encapsulating member 216 can be covered on the wavelength-converting member 219 and the submount 212. The light-emitting module 200 can be also applied to the embodiments shown in FIGS. 1D to 1G.

Figure 2B:
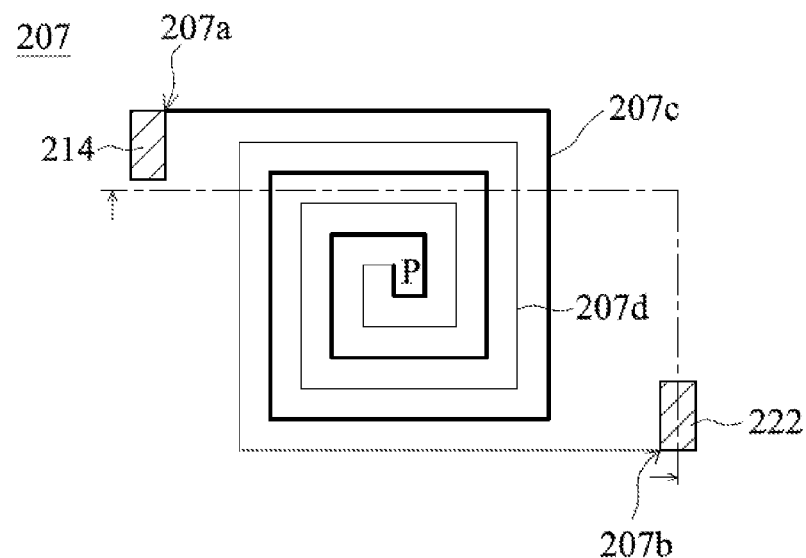
FIG. 2B shows an inductive coil in accordance with one embodiment of the present application.

As shown in FIG. 2B, from a top-perspective view of the light-emitting element 200. The first end 207a and the second end 207b are at the outermost part of the inductive coil 207. The first end 207a connects the first contact 205 via the first connecting portion 214, and the second contact 211 connects the second contact 211 via the second connecting portion 222. The inductive coil 207 further comprises a first spiral 207c and connecting a second spiral 207d at a central point P thereof, and the first spiral 207c and the second spiral 207d are coplanar. Each of the first spiral 207c and the second spiral 207d has multiple turns, and each of the first spiral 207c and the second spiral 207d can have more turns than that shown in FIG. 2B. The number of the first spiral 207c and the second spiral 207d can be from 100 to 200.

Figure 2C:
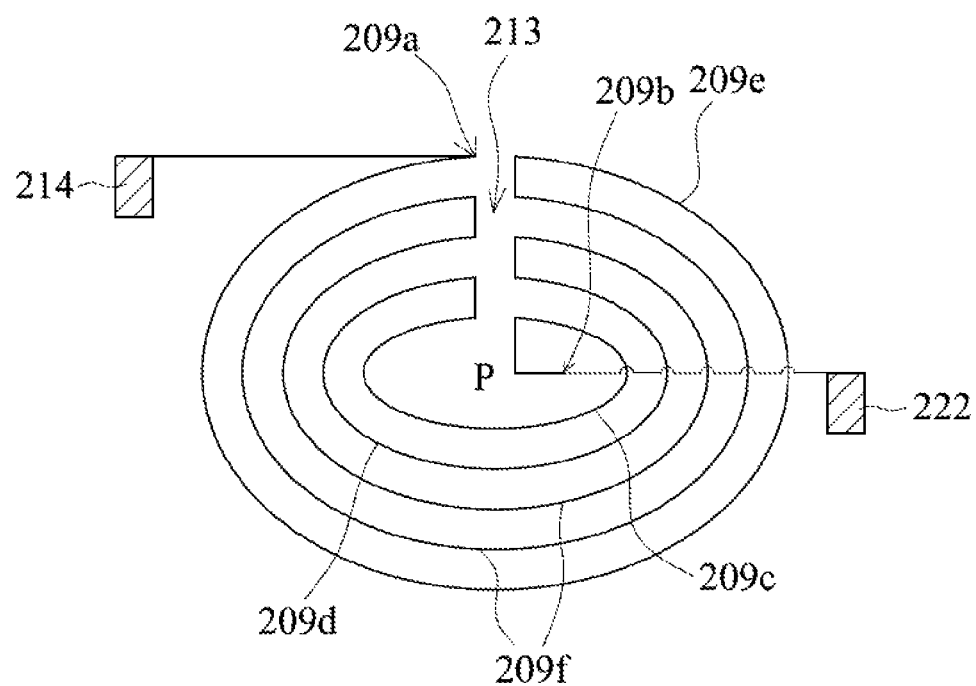
FIG. 2C shows an inductive coil in accordance with one embodiment of the present application.

Referring to FIG. 2C, an inductive coil 209 in accordance with one embodiment of the present application is disclosed. The inductive coil 207 in the light-emitting element 200 can be replaced by the inductive coil 209. The inductive coil 209 comprises a central point P, a first end 209a, a second end 209b, a first C-shaped turn 209c surrounding the central point P and a second C-shaped turn 209d surrounding and connecting to the first C-shaped turn 209c, a plurality of C-shaped turns 209f sequentially surrounding the second C-shaped turn 209d, and an outmost C-shaped turn 209e having the first end 209a. An opening 213 is through the first C-shaped turn 209c, the second C-shaped turn 209d, the plurality of C-shaped turns 209f and the outmost C-shaped turn 209e. The first C-shaped turn 209c is the innermost C-shaped turn connecting the central point P and the second end 209b. The number of the plurality of C-shaped turns 209f shown in FIG. 2C is two, however the practical number of C-shaped turns 209f can be more than that shown in FIG. 2C. The number of the first C-shaped turn 209c, the second C-shaped turn 209d, the plurality of C-shaped turns 209f and the outmost C-shaped turn 209e can be between 50 to 100.

Figure 3A:
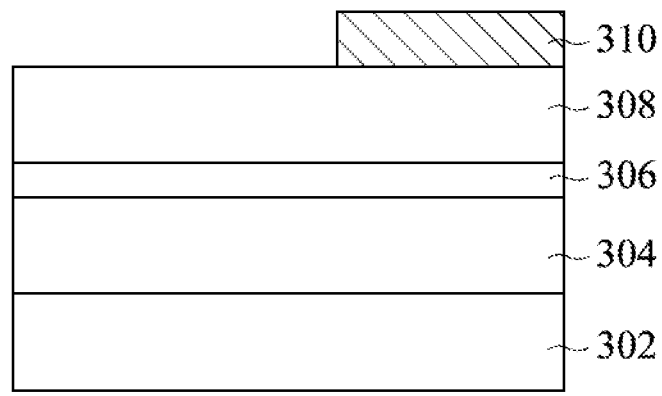
FIGS. 3A to 3G show a manufacturing method of a light-emitting element in accordance with one embodiment of the present application.
Figure 3B:
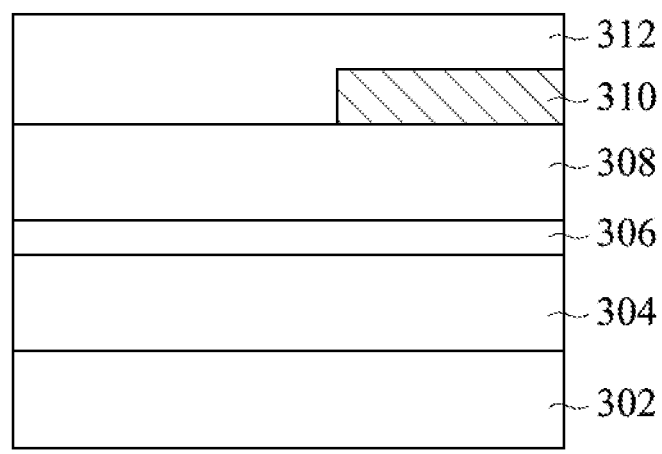
Figure 3C:
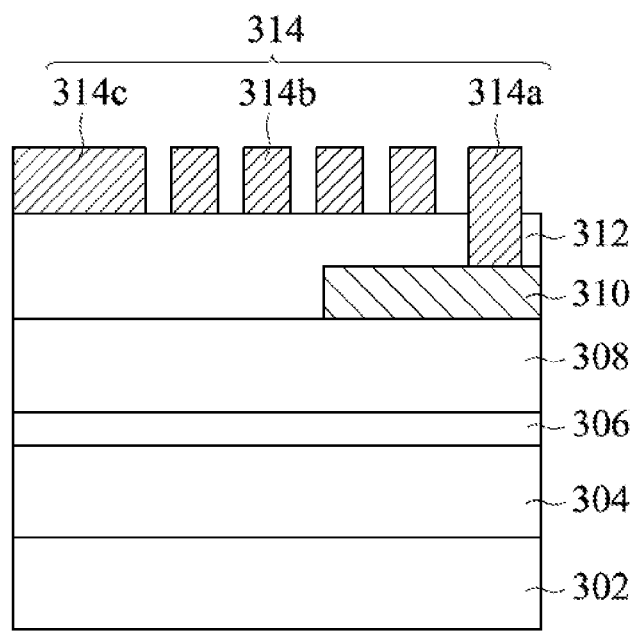
Figure 3D:
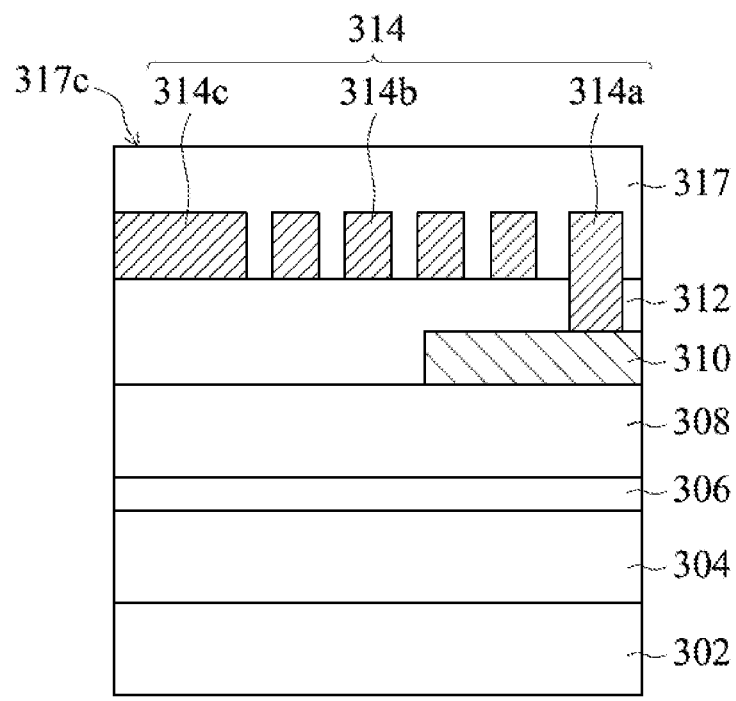
Figure 3E:
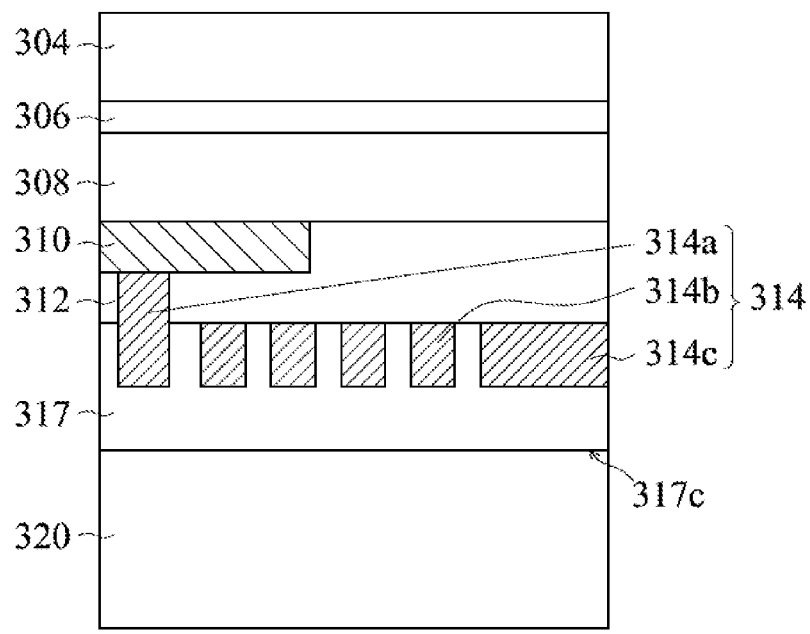
Figure 3F:
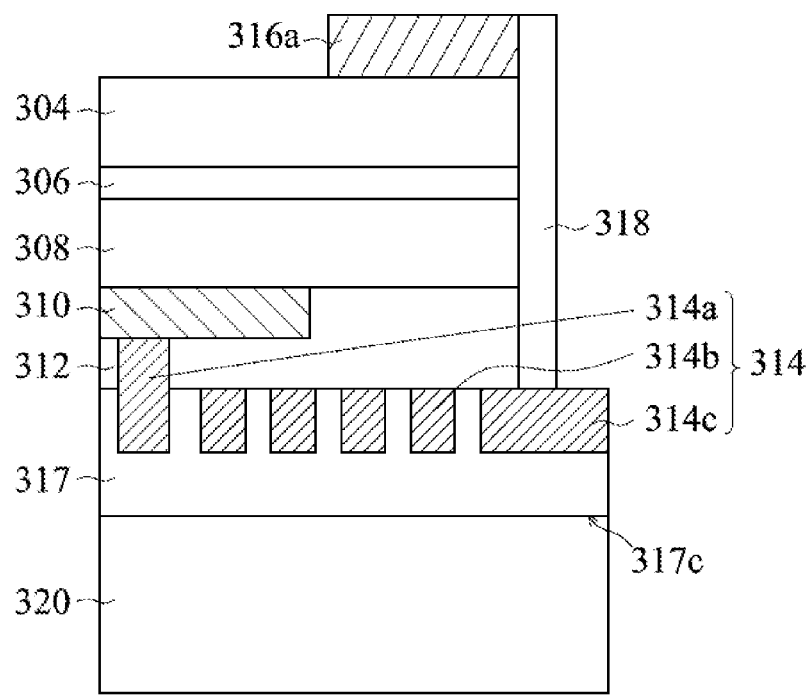
Figure 3G:
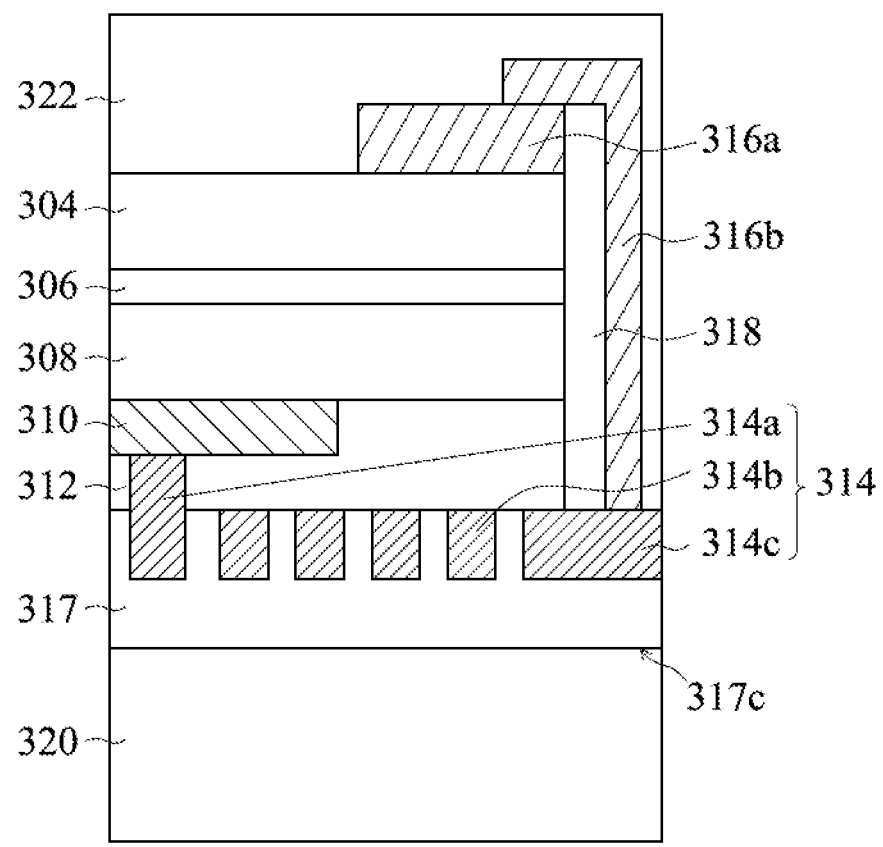

Referring to cross-sectional diagrams FIGS. 3A to 3G, a manufacturing method of a light-emitting element 300 in accordance with one embodiment of the present application is disclosed. As shown in FIG. 3A, an epitaxial substrate 302 is provided, and an n-type semiconductor layer 304, an active layer 306 and a p-type semiconductor layer 308 are sequentially formed on the epitaxial substrate 302, and a first electrode 310 is formed on the p-type semiconductor layer 308. The n-type semiconductor layer 304, active layer 306 and p-type semiconductor layer 308 can comprise III-V group semiconductor material such as $Al_{x1}In_{y1}Ga_{(1-x1-y1)}N$, wherein 0≤x1, y1≤1, (x1+y1)≤1 or $Al_{x2}In_{y2}Ga_{(1-x2-y2)}P$, wherein 0≤x2, y2≤1, (x2+y2)≤1. The material of the first electrode 310 can comprise metal such as Au, Al, Cr, Pt, Be, Ge, Ag or an alloy thereof, specifically, the first electrode 310 can be BeAu when the p-type semiconductor layer 308 is $Al_{x2}In_{y2}Ga_{(1-x2-y2)}P$. As shown in FIG. 3B, a first insulating adhesive layer 312 such as $SiO_2$ is formed on the p-type semiconductor layer 308, and the first electrode 310 is covered by the first insulating adhesive layer 312. As shown in FIG. 3C, a metal structure 314 is formed on the first insulating layer 312. The metal structure 314 comprises a first portion 314a penetrating the first insulating layer 312 and electrically connecting the first electrode 310, an inductive coil 314b and a second portion 314c on the insulating layer 312. The first portion 314a, the inductive coil 314b and the second portion 314c form a continuous pattern from a top view such as shown in FIG. 1B or 1C. As shown in FIGS. 3D and 3E, a second insulating adhesive layer 317 such as $SiO_2$ is formed on the first insulating adhesive layer 312, and the metal structure 314 is covered by the second insulating layer 317, and then a surface 317c of the second insulating layer 317 can be flatted by a Chemical-Mechanical Polishing (CMP) process. Then a transparent substrate 320 such as sapphire is bonded to the surface 317c by adding pressure on the interface between the transparent substrate 320 and the second insulating layer 317, and raising the environmental temperature. After the transparent substrate 320 and the second insulating layer 317 join together, the epitaxial substrate 302 can be removed. As shown in FIG. 3F, A second electrode 316a is formed on the n-type semiconductor layer 304, specifically, the second electrode 316a can be GeAuNi. A portion of the n-type semiconductor layer 304, active layer 306, p-type semiconductor layer 308 and the first insulating adhesive layer 312 are removed and expose a portion of the second portion 314c. A dielectric layer 318 is formed along the side surface of the n-type semiconductor layer 304, active layer 306 and p-type semiconductor layer 308 and the first insulating adhesive layer 312. As shown in FIG. 3G, a connecting layer 316b is formed along the dielectric layer 318, and two ends of the connecting layer 316b connect the second electrode 316a and the second portion 314c, respectively. An entirety comprising the second electrode 316a, the connecting layer 316b and the second portion 314c has the same function with that of the second connecting portion 114 shown in FIG. 1A. An entirety comprising the first portion 314a and the first electrode 310 has the same function with that of the first connecting portion 112. A passivation layer 322 can be formed on the n-type semiconductor layer 304. The second electrode 316*a* and connecting layer 316*b* are covered by the passivation layer 322.

Although the present application has been explained above, it is not the limitation of the range, the sequence in practice, the material in practice, or the method in practice. Any modification or decoration for present application is not detached from the spirit and the range of such.

What is claimed is:

1. A light-emitting module, comprising:
a submount;
a light-emitting element formed on the submount, comprising a first semiconductor layer having a first surface facing the submount, a second semiconductor layer having a second surface facing the submount, and an active layer between the first semiconductor layer and the second semiconductor layer;
a first electrode formed between the submount and the first semiconductor layer; a second electrode formed between the submount and the second semiconductor layer; and an inductive coil embedded in the submount, comprising a first end electrically connecting the first electrode, and a second end electrically connecting the second electrode.

2. The light-emitting module according to claim 1, wherein the submount comprises an upper surface disposing a first contact connecting the first electrode and a second contact connecting the second electrode thereon, and the first end electrically connects the first electrode via the first contact, and the second end electrically connects the second electrode via the second contact.

3. The light-emitting module according to claim 2, further comprising a first connecting portion connecting between the first end and the first contact and a second connecting portion connecting between the second end and the second contact in the submount.

4. The light-emitting module according to claim 1, wherein the second surface is farther away the submount than the first surface, and a portion of the first semiconductor layer and the active layer are removed to expose the second surface.

5. The light-emitting module according to claim 4, wherein the light-emitting element further comprises a current spreading layer formed on the first surface and a reflective metal layer on the current spreading layer.

6. The light-emitting module according to claim 1, further comprising an encapsulating member on the submount and covering the light-emitting stack.

7. The light-emitting module according to claim 6, wherein the encapsulating member comprises water-proof material, and a wavelength-converting material or photo catalyst is formed between the encapsulating member and the light-emitting element.

8. The light-emitting module according to claim 7, wherein the material of the inductive coil comprises a conductive metal or a metal having high magnetic susceptibility, a material of the conductive metal comprises Au, Al, Cu, Ag, or Ti, and a material of the metal having high magnetic susceptibility comprises Fe, Ni or Co.

* * * * *